United States Patent
Lee et al.

(10) Patent No.: US 6,730,551 B2
(45) Date of Patent: May 4, 2004

(54) FORMATION OF PLANAR STRAINED LAYERS

(75) Inventors: Minjoo L. Lee, Cambridge, MA (US); Christopher W. Leitz, Nashua, NH (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/211,126

(22) Filed: Aug. 2, 2002

(65) Prior Publication Data

US 2003/0025131 A1 Feb. 6, 2003

Related U.S. Application Data

(60) Provisional application No. 60/310,346, filed on Aug. 6, 2001.

(51) Int. Cl.$^7$ .............................................. H01L 21/337
(52) U.S. Cl. ...................................................... 438/191
(58) Field of Search ................................. 438/191, 933, 438/192–196, 198

(56) References Cited

U.S. PATENT DOCUMENTS 4,710,788 A   12/1987   Dämbkes et al.
4,920,076 A    4/1990   Holland et al.

(List continued on next page.)

FOREIGN PATENT DOCUMENTS

DE   41 01 167 A1   7/1992
EP    0 683 522 A2  11/1995

(List continued on next page.)

OTHER PUBLICATIONS

Meyerson et al., "Cooperative Growth Phenomena in Silicon/Germanium Low–Temperature Epitaxy," *Applied Physics Letters,* vol. 53, No. 25 (Dec. 19, 1988) pp. 2555–2557.
Garone et al., "Silicon vapor phase epitaxial growth catalysis by the presence of germane," *Applied Physics Letters,* vol. 56, No. 13 (Mar. 26, 1990) pp. 1275–1277.
Robbins et al., "A model for heterogeneous growth of $Si_{1-x}Ge_x$ films for hydrides," *Journal of Applied Physics,* vol. 69, No. 6 (Mar. 15, 1991) pp. 3729–3732.

(List continued on next page.)

*Primary Examiner*—Craig A. Thompson
(74) *Attorney, Agent, or Firm*—Testa Hurwitz & Thibeault LLP

(57) ABSTRACT

A structure and a method for forming the structure, the method including forming a compressively strained semiconductor layer, the compressively strained layer having a strain greater than or equal to 0.25%. A tensilely strained semiconductor layer is formed over the compressively strained layer. The compressively strained layer is substantially planar, having a surface roughness characterized in (i) having an average wavelength greater than an average wavelength of a carrier in the compressively strained layer or (ii) having an average height less than 10 nm.

23 Claims, 3 Drawing Sheets

U.S. PATENT DOCUMENTS

| | | |
|---|---|---|
| 4,990,979 A | 2/1991 | Otto |
| 5,241,197 A | 8/1993 | Murakami et al. |
| 5,291,439 A | 3/1994 | Kauffmann et al. |
| 5,312,766 A | 5/1994 | Aronowitz et al. |
| 5,327,375 A | 7/1994 | Harari |
| 5,442,205 A | 8/1995 | Brasen et al. |
| 5,461,243 A | 10/1995 | Ek et al. |
| 5,523,592 A | 6/1996 | Nakagawa et al. |
| 5,534,713 A | 7/1996 | Ismail et al. |
| 5,596,527 A | 1/1997 | Tomioka et al. |
| 5,617,351 A | 4/1997 | Bertin et al. |
| 5,683,934 A | 11/1997 | Candelaria |
| 5,739,567 A | 4/1998 | Wong |
| 5,777,347 A | 7/1998 | Bartelink |
| 5,780,922 A | 7/1998 | Mishra et al. |
| 5,786,612 A | 7/1998 | Otani et al. |
| 5,792,679 A | 8/1998 | Nakato |
| 5,808,344 A | 9/1998 | Ismail et al. |
| 5,847,419 A | 12/1998 | Imai et al. |
| 5,891,769 A | 4/1999 | Liaw et al. |
| 5,906,951 A | 5/1999 | Chu et al. |
| 5,986,287 A | 11/1999 | Eberl et al. |
| 5,998,807 A | 12/1999 | Lustig et al. |
| 6,013,134 A | 1/2000 | Chu et al. |
| 6,058,044 A | 5/2000 | Sugiura et al. |
| 6,059,895 A | 5/2000 | Chu et al. |
| 6,096,590 A | 8/2000 | Chan et al. |
| 6,107,653 A | 8/2000 | Fitzgerald |
| 6,111,267 A | 8/2000 | Fischer et al. |
| 6,117,750 A | 9/2000 | Bensahel et al. |
| 6,130,453 A | 10/2000 | Mei et al. |
| 6,143,636 A | 11/2000 | Forbes et al. |
| 6,204,529 B1 | 3/2001 | Lung et al. |
| 6,207,977 B1 | 3/2001 | Augusto |
| 6,249,022 B1 | 6/2001 | Lin et al. |
| 6,251,755 B1 | 6/2001 | Furukawa et al. |
| 6,266,278 B1 | 7/2001 | Harari et al. |
| 6,333,518 B1 * | 12/2001 | Seo ............................ 257/72 |
| 6,339,232 B1 | 1/2002 | Takagi |
| 6,350,993 B1 | 2/2002 | Chu et al. |
| 6,399,970 B2 | 6/2002 | Kubo et al. |
| 6,498,359 B2 | 12/2002 | Schmidt et al. |
| 2001/0003364 A1 | 6/2001 | Sugawara et al. |
| 2002/0072130 A1 * | 6/2002 | Cheng et al. ................ 438/10 |
| 2002/0100942 A1 | 8/2002 | Fitzgerald et al. |
| 2002/0125471 A1 | 9/2002 | Fitzgerald et al. |
| 2002/0125497 A1 | 9/2002 | Fitzgerald |
| 2002/0140031 A1 | 10/2002 | Rim |

FOREIGN PATENT DOCUMENTS

| | | |
|---|---|---|
| EP | 0 829 908 A2 | 3/1998 |
| EP | 0 838 858 A2 | 4/1998 |
| EP | 0 844 651 A1 | 5/1998 |
| EP | 1 020 900 A2 | 7/2000 |
| EP | 1 174 928 A1 | 1/2002 |
| JP | 63122176 | 5/1988 |
| JP | 4-307974 | 10/1992 |
| JP | 7-106466 | 4/1995 |
| JP | 11-233744 | 8/1999 |
| JP | 2001319935 | 5/2000 |
| WO | WO 98/59365 | 12/1998 |
| WO | WO 99/53539 | 10/1999 |
| WO | WO 00/54338 | 9/2000 |
| WO | WO 01/54202 A1 | 7/2001 |
| WO | WO 01/93338 A1 | 12/2001 |
| WO | WO 01/99169 A2 | 12/2001 |
| WO | WO 02/13262 A2 | 2/2002 |
| WO | WO 02/15244 A2 | 2/2002 |
| WO | WO 02/47168 A2 | 6/2002 |
| WO | WO 02/071488 A1 | 9/2002 |
| WO | WO 02/071491 A1 | 9/2002 |
| WO | WO 02/071495 A1 | 9/2002 |

OTHER PUBLICATIONS

"2 Bit/Cell EEPROM Cell Using Band–to–Band Tunneling for Data Read–Out," *IBM Technical Disclosure Bulletin*, vol. 35, No. 4B (Sep. 1992) pp. 136–140.

Wesler et al., "NMOS and PMOS Transistors Fabricated in Strained/Relaxed Silicon–Germanium Structures," *Electron Devices Meeting, 1992. Technical Digest* (Dec. 13, 1992) pp. 31.7.1–31.7.3.

Grützmacher et al., "Ge segregation in SiGe/Si heterostructures and its dependence on deposition technique and growth atmosphere," *Applied Physics Letters*, vol. 63, No. 18 (Nov. 1, 1993) pp. 2531–2533.

Welser et al., "Evidence of Real–Space Hot–Electron Transfer in High Mobility, Strained–Si Multilayer MOSFETs," *Electron Devices meetings, 1993. Technical Digest* (Dec. 1993) pp. 21.3.1–21.3.4.

Cullis et al, "Growth ripples upon strained SiGe epitaxial layers on Si and misfit dislocation interactions," *Journal of Vacuum Science and Technology A*, vol. 12, No. 4 (Jul./Aug. 1994) pp. 1924–1931.

Tweet et al., "Factors determining the composition of strained GeSi layers grown with disilane and germane," *Applied Physics Letters*, vol. 65, No. 20 (Nov. 14, 1994) pp. 2579–2581.

Armstrong et al., "Design of Si/SiGe Heterojunction Complementary Metal–Oxide–Semiconductor Transistors," *IEDM Technical Digest* (1995) pp. 761–764.

König et al., "SiGe HBTs and HFETs," *Solid–State Electronics*, vol. 38, No. 9 (1995) pp. 1595–1602.

Rim et al., "Enhanced Hole Mobilities in Surface–Channel Strained–Si p–MOSFETs," Solid State Electronics Laboratory, Stanford University, Stanford, CA 94305 (1995) pp. 20.3.1–20.3.4.

Welser, "The Application of Strained Silicon/Relaxed Silicon Germanium Heterostructures to Metal–Oxide–Semiconductor Field–Effect Transistors," Ph.D. Thesis, Stanford University (1995) pp. 1–205.

Sadek et al., "Design of Si/SiGe Heterojunction Complementary Metal–Oxide–Semiconductor Transistors," *IEEE Transactions on Electron Devices*, vol. 43, No. 8 (Aug. 1996) pp. 1224–1232.

Nayak et al., "High Mobility Strained–Si PMOSFET's," *IEEE Transactions on Electron Devices*, vol. 43, No. 10 (Oct. 1996) pp. 1709–1716.

Schäfler, "High–mobility Si and Ge structures," *Semicond. Sci. Technol.*, vol. 12 (1997) pp. 1515–1549.

Usami et al., "Spectroscopic study of Si–based quantum wells with neighboring confinement structure," *Semicon. Sci. Technol.* (1997) (abstract).

König et al., "Design Rules for n–Type SiGe Hetero FETs," *Solid State Electronics*, vol. 41, No. 10 (1997), pp. 1541–1547.

Höck et al., "Carrier mobilities in modulation doped $Si_{1-x}Ge_x$ heterostructures with respect to FET applications," *Thin Solid Films*, vol. 336 (1998) pp. 141–144.

Maiti et al., "Strained–Si heterostructure field effect transistors," *Semicond. Sci. Technol.*, vol. 13 (1998) pp. 1225–1246.

Hackbarth et al., "Strain relieved SiGe buffers for Si–based field–effect transistors," *Journal of Crystal Growth*, vol. 201 (1999) pp. 734–738.

Armstrong, "Technology for SiGe Heterostructure–Based CMOS Devices," Submitted to the Massachusetts Institute of Technology Department of Electrical Engineering and Computer Science on Jun. 30, 1999, pp. 1–154.

O'Neill et al., "SiGe Virtual substrate N–channel heterojunction MOSFETs," *Semicond. Sci. Technol.*, vol. 14 (1999) pp. 784–789.

Rim, "Application of Silicon Based Heterostrucutres to Enhanced Mobility Metal–Oxide–Semiconductor Field–Effect Transistors," Ph.D. Thesis, Stanford University (Jul. 1999) pp. 1–184.

Parker et al., "SiGe heterostructure CMOS circuits and applications," *Solid State Electronics*, vol. 43, No. 8, (Aug. 1999) pp. 1497–1506.

Xie, "SiGe Field effect transistors," *Materials Science and Engineering*, vol. 25 (1999) pp. 89–121.

Hackbarth et al., "Alternatives to thick MBE–grown relaxed SiGe buffers," *Thin Solid Films*, vol. 369, No. 1–2 (2000) pp. 148–151.

Herzog et al., "SiGe–based FETs: buffer issues and device results," *Thin Solid Films*, vol. 380 (2000) pp. 36–41.

Mizuno et al., "Electron and Hole Mobility Enhancement in Strained–Si MOSFET's on SiGe–on–Insulator Substrates Fabricated by SIMOX Technology," *IEEE Electron Device Letters*, vol. 21, No. 5 (May 2000) pp. 230–232.

Höck et al., "High hole mobility in $Si_{0.17}Ge_{0.83}$ channel metal–oxide–semiconductor field–effect transistors grown by plasma–enhanced chemical vapor deposition," *Applied Physics Letters*, vol. 76, No. 26 (Jun. 26, 2000) pp. 3920–3922.

Rim et al., "Fabrication and Analysis of Deep Submicron Strained–Si N–MOSFET's," *IEEE Transactions on Electron Devices*, vol. 47, No. 7 (Jul. 2000) pp. 1406–1415.

Barradas et al., "RBS analysis of MBE–grown Si/Ge/(001) Si heterostructures with thin, high Ge content SiGe channels for HMOS transistors," *Modern Physics Letters B* (2001) (abstract).

Cheng et al., "Relaxed Silicon–Germanium on Insulator Substrate by Layer Transfer," *Journal of Electronic Materials*, vol. 30, No. 12 (2001) pp. L37–L39.

Lee et al., "Strained Ge channel p–type metal–oxide–semiconductor field–effect transistors grown on $Si_{1-x}Ge_x$/Si virtual substrates," *Applied Physics Letters*, vol. 79, No. 20 (Nov. 12, 2001) pp. 3344–3346.

Leitz et al., "Hole mobility enhancements in strained $Si/Si_{1-y}Ge_y$ p–type metal–oxide–semiconductor field–effect transistors grown on relaxed $Si_{1-x}Ge_x$ (x<y) virtual substrates," *Applied Physics Letters*, vol. 79, No. 25 (Dec. 17, 2001) pp. 4246–4248.

Canaperi et al., "Preparation of a relaxed Si–Ge layer on an insulator in fabricating high–speed semiconductor devices with strained epitaxial films," *Intern. Business Machines Corporation*, USA (2002) (abstract).

Lee et al., "Strained Ge channel p–type MOSFETs fabricated on $Si_{1-x}Ge_x$/Si virtual substrates," *Mat. Res. Soc. Symp. Proc.*, vol. 686 (2002) pp. A1.9.1–A1.9.5.

Leitz et al., "Channel Engineering of SiGe–Based Heterostructures for High Mobility MOSFETs," *Mat. Res. Soc. Symp. Proc.*, vol. 686 (2002) pp. A3.10.1–A3.10.6.

Li et al., "Design of high speed Si/SiGe heterojunction complementary metal–oxide–semiconductor field effect transistors with reduced short–channel effects," *J. Vac. Sci. Technol.*, A 20(3) (May/Jun. 2002) pp. 1030–1033.

Eaglesham et al., "Dislocation–Free Stranski–Krastanow Growth of Ge on Si(100)," *Physical Review Letters*, vol. 64, No. 16 (Apr. 16, 1990) pp. 1943–1946.

Fitzgerald et al., "Totally relaxed $Ge_xSi_{1-x}$ layers with low threading dislocation densities grown on Si substrates," *Appl. Phys. Lett.*, vol. 59, No. 7 (Aug. 12, 1991) pp. 811–813.

Fitzgerald et al., "Relaxed $Ge_xSi_{1-x}$ structures for III–V integration with Si and high mobility two–dimensional electron gases in Si," *J. Vac. Sci. Technol. B*, vol. 10, No. 4 (Jul./Aug. 1992) pp. 1807–1819.

Xie et al., "Very high mobility two–dimensional hole gas in Si/ $Ge_xSi_{1-x}$Ge structures grown by molecular beam epitaxy," *Appl. Phys. Lett.*, vol. 63, No. 16 (Oct. 18, 1993) pp. 2263–2264.

Wesler et al., "Electron Mobility Enhancement in Strained–Si N–Type Metal–Oxide–Semiconductor FieldEffect Transistors," *IEEE Electron Device Letters*, vol. 15, No. 3 (Mar. 1994) pp. 100–102.

Ismail et al., "Modulation–doped n–type Si/SiGe with inverted interface," *Appl. Phys. Lett.*, vol. 65, No. 10 (Sep. 5, 1994) pp. 1248–1250.

Xie et al., "Semiconductor Surface Roughness: Dependence on Sign and Magnitude of Bulk Strain," *The Physical Review Letters*, vol. 73, No. 22 (Nov. 28, 1994) pp. 3006–3009.

Bouillon et al., "Search for the optimal channel architecture for 0.18/0.12 μm bulk CMOS Experimental study," *IEEE*, (1996) pp. 21.2.1–21.2.4.

Kearney et al., "The effect of alloy scattering on the mobility of holes in a $Si_{1-x}Ge_x$ quantum well," *Semicond. Sci. Technol.*, vol. 13 (1998) pp. 174–180.

Höck et al., "High performance 0.25 μm p–type Ge/SiGe MODFETs," *Electronic Letters*, vol. 34, No. 19 (Sep. 17, 1998) pp. 1888–1889.

Bufler et al., "Hole transport in strained $Si_{1-x}Ge_x$ alloys on $Si_{1-y}Ge_y$ substrates," *Journal of Applied Physics*, vol. 84, No. 10 (Nov. 15, 1998) pp. 5597–5602.

Fitzgerald et al., "Dislocation dynamics in relaxed graded composition semiconductors," *Materials Science and Engineering B67*, (1999) pp. 53–61.

Fischetti, "Long–range Coulomb interactions in small Si devices. Part II. Effective electronmobility in thin–oxide structures," *Journal of Applied Physics*, vol. 89, No. 2 (Jan. 15, 2001) pp. 1232–1250.

Cheng et al., "Electron Mobility Enhancement in Strained–Si n–MOSFETs Fabricated on SiGe–on–Insulator (SGOI) Substrates," *IEEE Electron Device Letters*, vol. 22, No. 7 (Jul. 2001) pp. 321–323.

Leitz et al., "Dislocation glide and blocking kinetics in compositionally graded SiGe/Si," *Journal of Applied Physics*, vol. 90, No. 6 (Sep. 15, 2001) pp. 2730–2736.

Currie et al., "Carrier mobilities and process stability of strained S in– and p–MOSFETs on SiGe virtual substrates," *J. Vac. Sci. Technol. B.*, vol. 19, No. 6 (Nov./Dec. 2001) pp. 2268–2279.

Ransom et al., "Gate–Self–Aligned n–channel and p–channel Germanium MOSFET's," *IEEE Transactions on Electron Devices*, vol. 38, No. 12 (Dec. 1991) pp. 2695.

König et al., "p–Type Ge–Channel MODFET's with High Transconductance Grown on Si Substrates," *IEEE Electron Device Letters,* vol. 14, No. 4 (Apr. 1993) pp. 205–207.

Fischetti et al., "Brand structure, deformation potentials, and carrier mobility in strained Si, Ge, and SiGe alloys," *J. Appl. Phys.,* vol. 80, No. 4 (Aug. 15, 1996) pp. 2234–2252.

Currie et al., "Controlling threading dislocation in Ge on Si using graded SiGe layers and chemical–mechanical polishing," *Applied Physics Letters,* vol. 72, No. 14 (Apr. 6, 1998) pp 1718–1720.

Reinking et al., "Fabrication of high–mobility Ge p–channel MOSFETs on Si substrates," *Electronics Letters,* vol. 35, No. 6 (Mar. 18, 1999) pp. 503–504.

Koester et al., "Extremely High Transconductance Ge/$Si_{0.4}Ge_{0.6}$ p–MODFET's Grown by UHV–CVD," *IEEE Electron Device Letters,* vol. 21, No. 3 (Mar. 2000) pp. 110–112.

Carlin et al., "High Efficiency GaAs–on–Si Solar Cells with High $V_{oc}$ Using Graded GeSi Buffers," *IEEE,* (2000) pp. 1006–1011.

Rosenblad et al., "Virtual Substrates for the n– and p–type Si–MODFET Grown at Very High Rates," *Materials Science and Engineering,* vol. B74 (2000) pp. 113–117.

Ueno et al., "Low Temperature Buffer Growth for Modulation Doped SiGe/Ge/SiGe Heterostructures with High Hole Mobility," *Thin Solid Films,* vol. 369 (2000) pp. 320–323.

Yousif et al., "Recent Critical Issues in Si/$Si_{1-x}Ge_x$Si Heterostructure FET Devices," *Solid–State Electronics,* vol. 45, No. 11 (2001) pp. 1931–1937.

Anonymous, "Germanium P–Channel Mosfet," *IBM Technical Disclosure Bulletin,* vol. 28, No. 2 (Jul. 1, 1985) p. 500.

Aigouy et al., "MOVPE Growth and optical characterization of ZnSe/ZnS strained layer superlattices," *Superlattices and Microstructures,* vol. 16, No. 1 (1994) pp. 71–76.

Kikkawa et al., "Effect of strained InGaAs step bunching on mobility and device performance in n–InGaP/InGaAs/GaAs pseudomorphic heterostructures grown by metalorganic vapor phase epitaxy," *Journal of Crystal Growth,* vol. 145 (1994) pp. 799–807.

Pelekanos et al., "Interface roughness correlation in CdTe/CdZnTe strained quantum wells," *Journal of Crystal Growth,* vol. 184/185 (1998) pp. 886–889.

Srolovitz, "On the Stability of Surfaces of Stressed Solids," *Acta metall.,* vol. 37, No. 2 (1989) pp. 621–625.

Cullis et al, "The characteristics of strain–modulated surface undulations formed upon epitaxial $Si_{1-x}Ge_x$ alloy layers on Si," *Journal of Crystal Growth,* vol. 123 (1992) pp. 333–343.

Wolf et al., "Silicon Processing for the VLSI Era, vol. 1: Process Technology" (1986) pp. 201.

* cited by examiner

FORMATION OF PLANAR STRAINED LAYERS

RELATED APPLICATIONS

This application claims the benefit of U.S. Provisional Application 60/310,346, filed Aug. 6, 2001, the entire disclosure of which is hereby incorporated by reference herein.

Government Support

This invention was made with government support under Grant Number N66001-00-1-8954, awarded by the U.S. Navy. The government has certain rights in the invention.

FILED OF THE INVENTION

This invention relates generally to semiconductor substrates and particularly to semiconductor substrates with strained layers.

BACKGROUND

The recent development of silicon (Si) substrates with strained layers has increased the options available for design and fabrication of field-effect transistors (FETs). Enhanced performance of n-type metal-oxide-semiconductor (NMOS) transistors has been demonstrated with heterojunction metal-oxide-semiconductor field effect transistors (MOSFETs) built on substrates having strained silicon and relaxed silicon-germanium (SiGe) layers. Tensilely strained silicon significantly enhances electron mobilities. NMOS devices with strained silicon surface channels, therefore, exhibit improved performance with higher switching speeds. Hole mobilities are enhanced in tensilely strained silicon as well, but to a lesser extent for strain levels less than approximately 1.5%. Accordingly, equivalent enhancement of p-type metal-oxide-semiconductor (PMOS) device performance in such surface-channel devices presents a challenge.

Hole mobility enhancement has been demonstrated in highly strained SiGe layers. The formation of such highly strained layers is made difficult by the tendency of these layers to undulate, especially with increasing strain levels, i.e., with high Ge content. This undulation lowers hole mobilities, thereby offsetting the beneficial mobility enhancement provided by the strained layers.

The observed undulation arises from lattice mismatch with respect to an underlying layer, and increases in severity with formation temperature. Unfortunately, the formation of a tensilely strained layer made of, for example, Si, over the compressively strained layer is desirably carried out at a relatively high temperature, e.g., 550° C., to achieve a commercially viable formation rate and uniformity.

SUMMARY

The present invention facilitates formation of the tensilely strained layer at a relatively high average temperature, while keeping the compressively strained layer substantially planar. In accordance with the invention, the tensilely strained layer is initially grown at a relatively low temperature (i.e., sufficiently low to avoid undulations in the compressively strained layer) until a thin layer of the tensilely strained layer has been formed. It is found that this thin layer suppresses undulation in the compressively strained layer even at higher process temperatures that would ordinarily induce such undulation. As a result, formation of the tensilely strained layer may continue at these higher temperatures without sacrificing planarity.

In one aspect, therefore, the invention features a method for forming a structure based on forming a compressively strained semiconductor layer having a strain greater than or equal to 0.25%. A tensilely strained semiconductor layer is formed over the compressively strained layer. The compressively strained layer is substantially planar, having a surface roughness characterized by at least one of (i) an average roughness wavelength greater than an average wavelength of a carrier in the compressively strained layer and (ii) an average roughness height less than 10 nm.

One or more of the following features may also be included. The compressively strained layer may include at least one group IV element, such as at least one of silicon and germanium. The compressively strained layer may include >1% germanium. The tensilely strained layer may include silicon. The compressively strained layer may include at least one of a group III and a group V element. The compressively strained layer may include indium gallium arsenide, indium gallium phosphide, and/or gallium arsenide. The compressively strained layer may include at least one of a group II and a group VI element. The compressively strained layer may include zinc selenide, sulphur, cadmium telluride, and/or mercury telluride. The compressively strained layer may have a thickness of less than 500 Å, including less than 200 Å.

The compressively strained layer may be formed at a first temperature, and at least a portion of the tensilely strained layer may be formed at a second temperature, with the second temperature being greater than the first temperature. The tensilely strained layer may include silicon and the second temperature may be greater than 450° C. A first portion of the tensilely strained layer may be formed at a first temperature and a second portion of the tensilely strained layer may be formed at the second temperature, the first temperature being sufficiently low to substantially avoid disruption of planarity, with the first portion of the tensilely strained layer maintaining the planarity of the compressively strained layer notwithstanding transition to the second temperature.

The tensilely strained layer may be formed at a rate greater than 100 Å/hour. The compressively strained layer and/or the tensilely strained layer may formed by chemical vapor deposition. The wavelength of the surface roughness may be greater than 10 nanometers (nm).

In another aspect, the invention features a structure including a compressively strained semiconductor layer having a strain greater than or equal to 0.25% and a tensilely strained semiconductor layer disposed over the compressively strained layer. The compressively strained layer is substantially planar, having a surface roughness characterized by at least one of (i) an average roughness wavelength greater than an average wavelength of a carrier in the compressively strained layer and (ii) an average roughness height less than 10 nm.

One or more of the following features may also be included. The compressively strained layer may include a group IV element, such as at least one of silicon and germanium. The strain of the compressively strained layer may be greater than 1%. The compressively strained layer may have a thickness of less than 500 Å, including less than 200 Å. The wavelength of the surface roughness may be greater than 10 nm. The tensilely strained layer may include silicon.

The compressively strained layer may include at least one of a group III and a group V element. For example, the compressively strained layer may include indium gallium arsenide, indium gallium phosphide, and/or gallium arsenide.

The compressively strained layer may include at least one of a group II and a group VI element. For example, the compressively strained layer may include zinc selenide, sulphur, cadmium telluride, and/or mercury telluride.

The structure may also include a first transistor formed over the compressively strained layer. The first transistor may include a first gate dielectric portion disposed over a first portion of the compresssively strained layer, a first gate disposed over the first gate dielectric portion, the first gate comprising a first conducting layer, and a first source and a first drain disposed proximate the first gate and extending into the compressively strained layer. The first transistor may be an n-type metal-oxide-semiconductor field-effect transistor and the first source and first drain may include n-type dopants. The first transistor may be a p-type metal-oxide-semiconductor field-effect transistor and the first source and first drain may include p-type dopants.

The structure may also include a second transistor formed over the compressively strained layer. The second transistor may include a second gate dielectric portion disposed over a second portion of the compresssively strained layer, a second gate disposed over the second gate dielectric portion, the second gate including a second conducting layer, and a second source and a second drain disposed proximate the second gate and extending into the compressively strained layer. The first transistor may be an n-type metal-oxide-semiconductor field-effect transistor, with the first source and first drain including n-type dopants, and the second transistor may be a p-type metal-oxide-semiconductor field-effect transistor, with the second source and second drain including p-type dopants.

DETAILED DESCRIPTION

Figure 1:
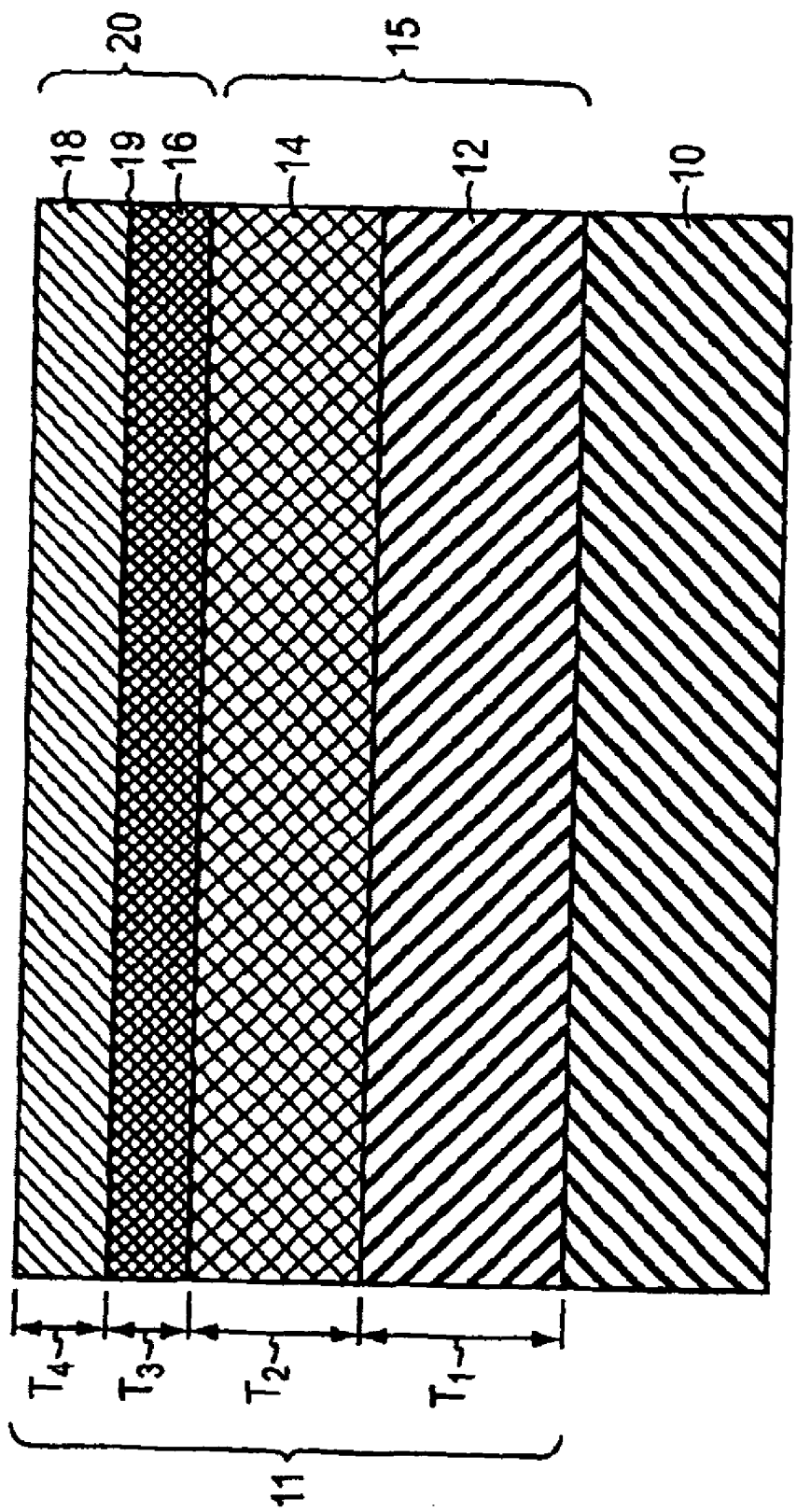
FIGS. 1 and 2 are schematic cross-sectional views of a semiconductor substrate with several semiconductor layers disposed thereon.

Referring to FIG. 1, which illustrates a structure amenable to use with the present invention, a substrate 10 is made of a semiconductor, such as silicon. Several layers collectively indicated at 11 are formed on substrate 10. Layers 11 may be grown, for example, in a chemical vapor deposition (CVD) system. In some embodiments, layers 11 are grown in an ultra-high vacuum chemical vapor deposition system (UHVCVD). In certain other embodiments, layers 11 may be grown in an atmospheric pressure CVD (APCVD) system or a low pressure CVD (LPCVD) system.

Layers 11 include a graded layer 12 disposed over substrate 10. Graded layer 12 may include Si and Ge with a grading rate of, for example, 10% Ge per micrometer ($\mu$m) of thickness, and a thickness $T_1$ of, for example, 2–9 $\mu$m. Graded layer 12 may be grown, for example, at 600–1100° C. A relaxed layer 14 is disposed over graded SiGe layer 12. Relaxed layer 14 may include $Si_{1-x}Ge_x$ with a uniform composition, containing, for example, 20–90% Ge and having a thickness $T_2$ of, e.g., 0.2–2 $\mu$m. In an embodiment, $T_2$ is 1.5 $\mu$m. A virtual substrate 15 includes relaxed layer 14 and graded layer 12.

A compressively strained layer 16 including a semiconductor material is disposed over relaxed layer 14. In an embodiment, compressively strained layer 16 includes group IV elements, such as $Si_{1-y}Ge_y$, with a Ge content (y) higher than the Ge content (x) of relaxed $Si_{1-x}Ge_x$ layer 14. Compressively strained layer 16 contains, for example, 1–100% Ge and has a thickness $T_3$ of, e.g., 10–500 angstroms (Å). The Ge content (x) of relaxed $Si_{1-x}Ge_x$ layer 14 may be 20–90%, and the Ge content (y) of compressively strained $Si_{1-y}Ge_y$ layer 16 may be 28–100%. In some embodiments, compressively strained layer 16 has a thickness $T_3$ of less than 500 Å. In certain embodiments, $T_3$ is less than 200 Å.

In some embodiments, compressively strained layer 16 includes at least one group III and/or one group V element. Compressively strained layer 16 may include, for example, indium gallium arsenide, indium gallium phosphide, or gallium arsenide.

In alternative embodiments, compressively strained layer 16 includes at least one group II and/or one group VI element. Compressively strained layer may include, for example, zinc selenide, sulphur, cadmium telluride, or mercury telluride.

A tensilely strained layer 18 is disposed over compressively strained layer 16, sharing an interface 19 with compressively strained layer 16. In an embodiment, tensilely strained layer 18 is formed of silicon. Tensilely strained layer 18 has a thickness $T_4$ of, for example, 50–300 Å. In an embodiment, thickness $T_4$ is approximately 200 Å.

Substrate 10 with layers 11 typically has a threading dislocation density of $10^5/cm^2$.

The requirements for attaining a substantially planar compressively strained $Si_{1-y}Ge_y$ layer 16 and an acceptably high growth rate for tensilely strained Si layer 18 formed by CVD are sometimes mutually exclusive. For example, a high growth rate of tensilely strained Si layer 18 is more readily achieved by deposition at high CVD temperatures. Further, higher CVD temperatures reduce the incorporation of impurities and improve layer uniformity. More specifically, tensilely strained Si layer 18 may be deposited by the use of a silane ($SiH_4$) source gas. Adequate growth rates, i.e., >0.01 Å/s with $SiH_4$, may be attained at 550° C. On the other hand, germane ($GeH_4$) and $SiH_4$ may be used to deposit compressively strained $Si_{1-y}Ge_y$ layer 16. $GeH_4$ decomposes at approximately 400° C. To remain planar after deposition, compressively strained $Si_{1-y}Ge_y$ layer 16 may need to be maintained at a relatively low temperature, i.e., less than the 550° C. temperature needed for subsequently achieving rapid Si deposition rates with $SiH_4$ to form tensilely strained Si layer 18.

As a result, maintaining adequate planarity of compressively strained $Si_{1-y}Ge_y$ layer 16 is a challenge, particularly with high Ge content, i.e., with y>40%. Si has a lattice constant of 5.431 Å and Ge has a lattice constant of 5.658 Å. The lattice mismatch between Si and Ge, therefore, is approximately 4%. Because of this lattice mismatch, a high Ge content leads to high compressive strain in compressively strained $Si_{1-y}Ge_y$ layer 16. High compressive strain may be desirable for attaining high carrier mobilities in subsequently fabricated devices.

Figure 2:
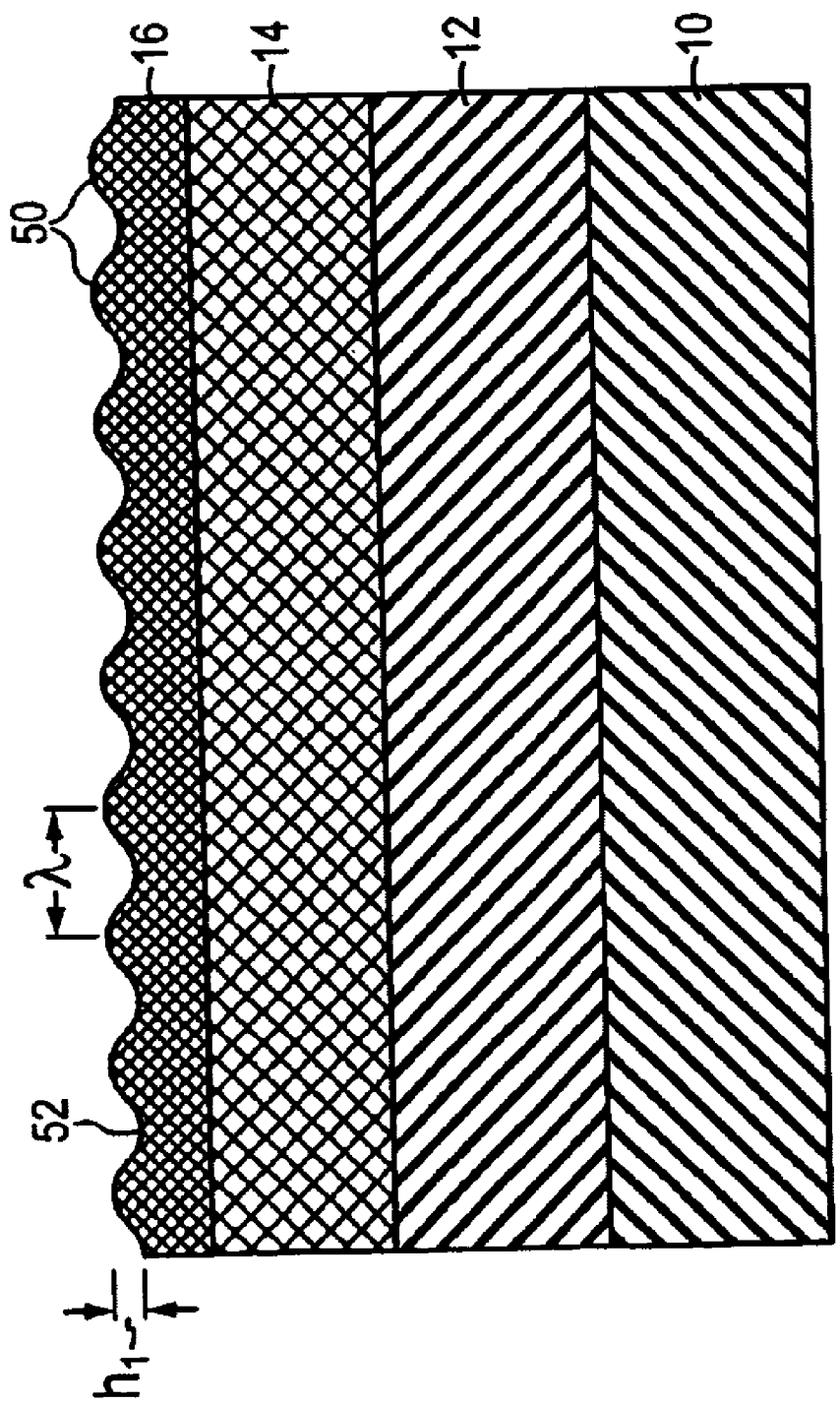

Referring to FIG. 2, the 4% difference in lattice constants of Si and Ge may lead to undulations 50 in a top surface 52 of compressively strained $Si_{1-y}Ge_y$ layer 16, particularly if the Ge content y is greater than 40%, and/or when the strain of compressively strained $Si_{1-y}Ge_y$ layer 16 is greater than 0.25%. Undulations 50 may form to partially accommodate the lattice mismatch between compressively strained $Si_{1-y}Ge_y$ layer 16 and relaxed layer 14. Undulations 50 may define a sinusoidal shape having a wavelength $\lambda$ and a height $h_1$. Wavelength $\lambda$ and height $h_1$ may depend on the Ge content of compressively strained $Si_{1-y}Ge_y$ layer 16, the lattice mismatch between compressively strained $Si_{1-y}Ge_y$ layer 16 and relaxed layer 14, and deposition conditions. Wavelength λ may be, for example, 1–100 nm, and height $h_1$ may be several nm, e.g., 5 nm. The sinusoidal shape of undulations 50 results in surface 52 having a surface roughness with wavelength λ. In an embodiment, the wavelength λ of the surface roughness is greater than a wavelength of a carrier in compressively strained $Si_{1-y}Ge_y$ layer 16. The surface roughness, therefore, does not reduce carrier mobility in compressively strained $Si_{1-y}Ge_y$ layer 16.

Referring to FIG. 2 and also to FIG. 1, a compressively strained $Si_{1-y}Ge_y$ layer 16 that is substantially planar may be grown as follows. Compressively strained $Si_{1-y}Ge_y$ layer 16 may be deposited at a first temperature low enough to enable formation of planar $Si_{1-y}Ge_y$ layers but not low enough to provide a suitably high deposition rate for tensilely strained Si layer 18. In the case of compressively strained $Si_{1-y}Ge_y$ layer 16 having a relatively high strain, e.g., greater than 0.25% and/or with y>40%, this deposition temperature for compressively strained $Si_{1-y}Ge_y$ layer 16 may be, e.g., 400° C. for UHVCVD using $SiH_4$ and $GeH_4$ source gases. The tensilely strained Si layer 18 may then be deposited in a two-step process. During the first step, the silicon source gas, e.g., $SiH_4$, is flowed while the growth temperature is slowly raised from a relatively low temperature, e.g., 400° C., to a final desired temperature in which the silicon growth rate is acceptably high. The final desired temperature may be, e.g., >450° C., such as 550° C., for UHVCVD using $SiH_4$ source gas. This step allows enough silicon to deposit at a low temperature to help stabilize the compressively strained $Si_{1-y}Ge_y$ layer 16 against strain-induced undulations, as explained below. Second, deposition of tensilely strained layer 18 may be completed at a faster rate at a second deposition temperature, e.g., a temperature greater than 450° C., such as 550° C., for UHVCVD using $SiH_4$ source gas. The deposition rate of tensilely strained layer 18 may be greater than 100 Å/hour. Another possible result of forming a substantially planar compressively strained $Si_{1-y}Ge_y$ layer 16 is an increase in wavelength λ of surface 52 of compressively strained $Si_{1-y}Ge_y$ layer 16. The increase in planarity may also be accompanied by a reduction in height $h_1$ of undulations to, e.g., less than 10 nm. After deposition of tensilely strained layer 18, compressively strained layer 16 has a surface roughness with wavelength λ greater than a wavelength of a carrier in compressively strained layer 16, e.g., greater than 10 nm.

A possible mechanism for formation of tensilely strained Si layer 18, deposited as described above, may be as follows. During the first step of the deposition of tensilely strained Si layer 18, surface 52 of compressively strained $Si_{1-y}Ge_y$ layer 16 is initially passivated by hydrogen atoms bonding to silicon and germanium during CVD when exposed to a hydrogen-containing source gas, such as $SiH_4$. The bond of hydrogen atoms to germanium, however, is relatively weak in comparison to the bond of hydrogen atoms to silicon. This bond strength difference is manifested, e.g., in the difference in the activation energy of decomposition of silane in UHVCVD (i.e., 2.22 eV) in comparison to the activation energy of decomposition of germane in UHVCVD (i.e., 1.68 eV). After passivation of surface 52, a surface exchange takes place in which a silicon atom from the $SiH_4$ source gas exchanges bonds to hydrogen with a germanium atom from compressively strained $Si_{1-y}Ge_y$ layer 16. The silicon atom thereby adheres to surface 52 of compressively strained $Si_{1-y}Ge_y$ layer 16, beginning formation of tensilely strained layer 18. Initially, a relatively fast growth rate of tensilely strained layer 18 may be attained at the relatively low temperature of approximately 400° C. because the exchange of Ge—H bonds with Si—H bonds is energetically favored and Ge atoms are directly at surface 52, or are relatively close to surface 52. Deposition at a higher temperature, however, may cause surface 52 to buckle excessively, resulting in undulations 50 with unacceptably short wavelength λ and/or high height $h_1$. As $SiH_4$ continues to flow and more Si atoms are deposited on surface 52 by exchange with Ge atoms, the deposition temperature may be raised. Buckling of surface 52 due to exposure to higher temperatures is prevented by the deposited Si atoms forming tensilely strained layer 18. Specifically, the deposited Si atoms physically suppress buckling of surface 52. As tensilely strained layer 18 becomes thicker, there is an increase in a migration path distance that Ge atoms in compressively strained $Si_{1-y}Ge_y$ layer 16 need to traverse to reach surface 52. This increase in Ge migration path distance becomes prohibitive, even at higher temperatures, resulting in Ge segregation from tensilely strained Si layer 18 and allowing the deposition of tensilely strained Si layer 18, substantially free of Ge. Consequently, initially depositing tensilely strained Si layer 18 at a relatively low temperature retards subsequent undulation formation, thereby facilitating completion of the deposition of tensilely strained Si layer at a higher temperature while maintaining the planarity of compressively strained layer 16.

In an alternative embodiment, during the first step of the deposition of tensilely strained Si layer 18, the flow of $SiH_4$ may be stopped during the increase in temperature, after the formation of a thin tensilely strained Si layer 18. The $SiH_4$ flow may then be resumed when the deposition system reaches the desired higher temperature.

In some embodiments, a substantially planar compressively strained $Si_{1-y}Ge_y$ layer 16 may be formed, with compressively strained $Si_{1-y}Ge_y$ layer 16 having a strain greater than 1%, by using the two-step silicon deposition process described above.

In another embodiment, compressively strained layer 16 may be formed as follows. Compressively strained $Si_{1-y}Ge_y$ layer 16 having a relatively low Ge content is deposited on relaxed $Si_{1-x}Ge_x$ layer 14, e.g., y~0.4–0.6, under relatively light compressive strain, e.g., y−x≈0.2. In this embodiment, device layers 20, including compressively strained $Si_{1-y}Ge_y$ layer 16 and tensilely strained Si layer 18, may be deposited at a temperature that permits deposition of planar compressively strained $Si_{1-y}Ge_y$ layer 16 and simultaneously provides an acceptably high growth rate, e.g., >0.01 Å/s, for tensilely strained Si layer 18. This temperature may be, e.g., 550° C. in ultrahigh vacuum chemical vapor deposition using $SiH_4$ and $GeH_4$ source gases.

Figure 3:
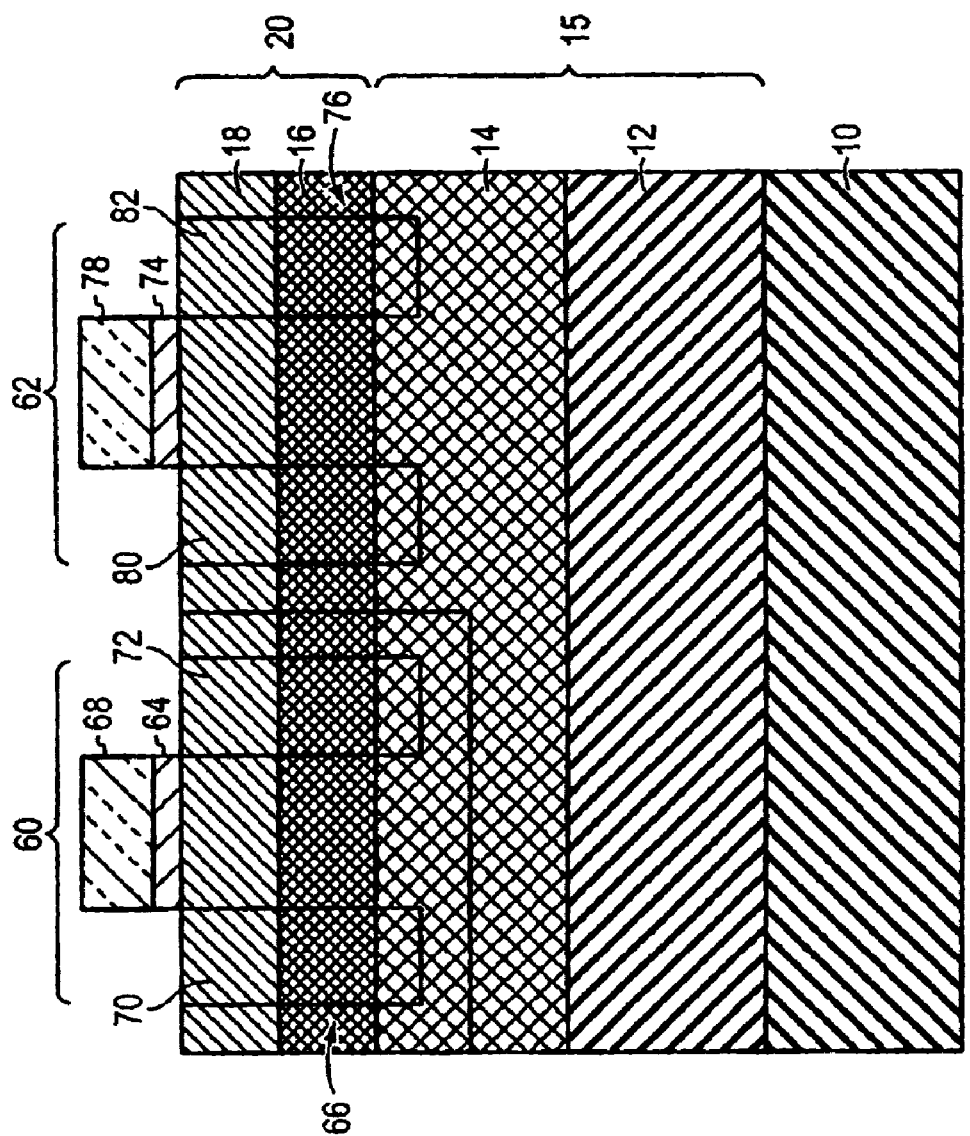
FIG. 3 is a schematic cross-sectional view of a semiconductor structure formed on a semiconductor substrate.

Referring to FIG. 3 as well as to FIGS. 1 and 2, a first transistor 60 and a second transistor 62 may be formed over a substantially planar compressively strained semiconductor layer 16 having a strain greater than or equal to 0.25%. Tensilely strained semiconductor layer 18 is disposed over compressively strained layer 16. First transistor 60 includes a first gate dielectric portion 64 disposed over a first portion 66 of compressively strained semiconductor layer 16. First dielectric portion 64 may be formed of a dielectric such as, e.g., silicon dioxide. A first gate 68 is disposed over first gate dielectric portion 64. First gate 68 includes a first conducting layer, such as, e.g., doped polysilicon. First transistor 60 also includes a first source 70 and a first drain 72 (defined for purposes of illustration by the interior boundaries), disposed proximate first gate 68 and extending into compressively strained layer 16. In an embodiment, first transistor 60 is a PMOS field-effect transistor, and first source 70 and first drain 72 are formed by the introduction of p-type dopants, such as boron. In an alternative embodiment, first transistor 60 is an NMOS field-effect transistor, and first source 70 and first drain 72 are formed by the introduction of n-type dopants, such as phosphorus or arsenic.

Second transistor 62 includes a second gate dielectric portion 74 disposed over second portion 76 of compressively strained semiconductor layer 16. Second dielectric portion 74 may be formed of a dielectric such as, e.g., silicon dioxide. A second gate 78 is disposed over second gate dielectric portion 74. Second gate 78 includes a second conducting layer, such as, e.g., doped polysilicon. Second transistor 62 also includes a second source 80 and a second drain 82 (defined for purposes of illustration by the interior boundaries), disposed proximate second gate 78 and extending into compressively strained layer 16. Second transistor 62 may be an NMOS field-effect transistor. Second source 80 and second drain 82 may be formed by the introduction of n-type dopants, such as phosphorus or arsenic.

In an embodiment, first transistor 60 is a PMOS field-effect transistor with first source 70 and first drain 72 including p-type dopants, and second transistor 62 is an NMOS field-effect transistor with second source 80 and second drain 82 including n-type dopants. Together, first transistor 60 and second transistor 62 form a complementary metal-oxide-semiconductor (CMOS) device.

The functionality of first and second transistors 60, 62 is enhanced by the use of substrate 10 with a substantially planar compressively strained semiconductor layer 16. The planarity of compressively strained semiconductor layer 16 enhances mobility of carriers within compressively strained layer 16, thereby enabling faster speeds during operation of first and second transistors 60, 62.

The invention may be embodied in other specific forms without departing from the spirit of essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced herein.

What is claimed is:

1. A method for forming a structure, the method including:

forming a compressively strained semiconductor layer, the compressively strained layer having a strain greater than or equal to 0.25%; and forming a tensilely strained semiconductor layer over the compressively strained layer, wherein the compressively strained layer is substantially planar, having a surface roughness characterized by at least one of (i) an average roughness wavelength greater than an average wavelength of a carrier in the compressively strained layer and (ii) an average roughness height less than 10 nm.

2. The method of claim 1, wherein the compressively strained layer comprises at least one group IV element.

3. The method of claim 1, wherein the compressively strained layer comprises at least one of silicon and germanium.

4. The method of claim 3, wherein the compressively strained layer comprises >1% germanium.

5. The method of claim 1, wherein the tensilely strained layer comprises silicon.

6. The method of claim 1, wherein the compressively strained layer comprises at least one of a group III and a group V element.

7. The method of claim 6, wherein the compressively strained layer comprises indium gallium arsenide.

8. The method of claim 6, wherein the compressively strained layer comprises indium gallium phosphide.

9. The method of claim 6, wherein the compressively strained layer comprises gallium arsenide.

10. The method of claim 1, wherein the compressively strained layer comprises at least one of a group II and a group VI element.

11. The method of claim 10, wherein the compressively strained layer comprises zinc selenide.

12. The method of claim 10, wherein the compressively strained layer comprises sulphur.

13. The method of claim 10, wherein the compressively strained layer comprises cadmium telluride.

14. The method of claim 10, wherein the compressively strained layer comprises mercury telluride.

15. The method of claim 1, wherein the compressively strained layer has a thickness of less than 500 Å.

16. The method of claim 15, wherein the compressively strained layer has a thickness of less than 200 Å.

17. The method of claim 1, wherein the compressively strained layer is formed at a first temperature, at least a portion of the tensilely strained layer is formed at a second temperature, and the second temperature is greater than the first temperature.

18. The method of claim 17, wherein the tensilely strained layer comprises silicon and the second temperature is greater than 450° C.

19. The method of claim 17, wherein forming the tensilely strained layer at a second temperature includes initially forming a first portion of the tensilely strained layer at the first temperature and forming a second portion of the tensilely strained layer at the second temperature, the first temperature being sufficiently low to substantially avoid disruption of planarity, the first portion of the tensilely strained layer maintaining the planarity of the compressively strained layer notwithstanding transition to the second temperature.

20. The method of claim 1, wherein the tensilely strained layer is formed at a rate greater than 100 Å/hour.

21. The method of claim 1, wherein the compressively strained layer is formed by chemical vapor deposition.

22. The method of claim 1, wherein the tensilely strained layer is formed by chemical vapor deposition.

23. The method of claim 1, wherein the wavelength of the surface roughness is greater than 10 nanometers.

* * * * *